United States Patent
Wang et al.

(10) Patent No.: US 8,546,234 B2
(45) Date of Patent: Oct. 1, 2013

(54) SEMICONDUCTOR PROCESS

(75) Inventors: Wen-Chieh Wang, Taoyuan County (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 177 days.

(21) Appl. No.: 13/154,427

(22) Filed: Jun. 6, 2011

(65) Prior Publication Data

US 2012/0309192 A1 Dec. 6, 2012

(51) Int. Cl.
*H01L 21/20* (2006.01)

(52) U.S. Cl.
USPC .................. 438/391; 438/246; 257/E21.551; 257/E21.553

(58) Field of Classification Search
USPC ......... 438/246, 248, 359, 391; 257/E21.551, 257/E21.553
See application file for complete search history.

(56) References Cited

U.S. PATENT DOCUMENTS

| | | | |
|---|---|---|---|
| 6,235,610 B1 * | 5/2001 | Nicotra et al. | 438/433 |
| 2009/0004813 A1 * | 1/2009 | Lee | 438/421 |
| 2012/0132926 A1 * | 5/2012 | Nakano et al. | 257/77 |

FOREIGN PATENT DOCUMENTS

JP 04-067648 * 3/1992

OTHER PUBLICATIONS

Abstract of JP04-067648 Murata Mineo, (Mar. 1992) 2 pages.*

* cited by examiner

*Primary Examiner* — Caridad Everhart
(74) *Attorney, Agent, or Firm* — Jianq Chyun IP Office

(57) ABSTRACT

A semiconductor process is provided. A mask layer is formed on a substrate and has a first opening exposing a portion of the substrate. Using the mask layer as a mask, a dry etching process is performed on the substrate to form a second opening therein. The second opening has a bottom portion and a side wall extending upwards and outwards from the bottom portion, wherein the bottom portion is exposed by the first opening and the side wall is covered by the mask layer. Using the mask layer as a mask, a vertical ion implantation process is performed on the bottom portion. A conversion process is performed, so as to form converting layers on the side wall and the bottom portion of the second opening, wherein a thickness of the converting layer on the side wall is larger than a thickness of the converting layer on the bottom portion.

9 Claims, 9 Drawing Sheets

SEMICONDUCTOR PROCESS

BACKGROUND OF THE INVENTION

1. Field of the Invention

The invention relates to a semiconductor process.

2. Description of Related Art

With advancement of technologies, the level of integration of electronic devices tends to be raised, so as to comply with current demands for lightness, thinness, shortness, and smallness. In order to improve the level of integration, not only dimensions of semiconductor devices can be reduced, but also the distance between semiconductor components can be decreased. Nevertheless, either the size reduction of the semiconductor devices or the decrease in the distance between the semiconductor components may result in certain issues.

In general, in the fabrication of the gates, an ion implantation process is applied to define a spacer oxide layer or a gate oxide layer. For example, after an opening is formed in a material layer, the surface of the opening is doped by an ion implantation process. Then, a converting process (i.e. an oxidation process) is performed on the surface of the opening to form a converting layer (i.e. an oxide layer) thereon, and a conductive material is filled in the opening to form a gate. However, the scattering effect is likely to occur in the ion implantation process due to the decrease of the dimensions of the opening, and therefore the doping profile is difficult to control. That is, in the side wall of the opening fabricated as described above, the doping depth of an upper portion and a lower portion is different. Therefore, the converting layer subsequently formed on the side wall of the opening may have non-uniform thickness, and the insulation effect of the converting layer is negatively affected.

SUMMARY OF THE INVENTION

The invention is directed to a semiconductor process which can form a converting layer with superior insulation effect on a surface of the opening.

The invention provides a semiconductor fabricating process. A mask layer is formed on a substrate and has a first opening exposing a portion of the substrate. By using the mask layer as a mask, a dry etching process is performed on the substrate to form a second opening therein. The second opening has a bottom portion and a side wall extending upwards and outwards from the bottom portion, wherein the bottom portion is exposed by the first opening of the mask layer, and the side wall is covered by the mask layer. By using the mask layer as a mask, a vertical ion implantation process is performed on the bottom portion of the second opening through the first opening. A conversion process is performed on the substrate, so as to form converting layers on the side wall and the bottom portion of the second opening, wherein a thickness of the converting layer on the side wall is larger than a thickness of the converting layer on the bottom portion.

According to an embodiment of the invention, the dry etching process includes an in-situ widening etching process.

According to an embodiment of the invention, the side wall of the second opening is covered by the mask layer during the vertical ion implantation process.

According to an embodiment of the invention, a plurality of conductive patterns is formed in the substrate before the mask layer is formed, and the second opening is formed between the conductive patterns.

According to an embodiment of the invention, the mask layer is removed before the converting process.

According to an embodiment of the invention, a conductive layer is formed in the second opening after the converting process.

According to an embodiment of the invention, the first opening includes a slit.

According to an embodiment of the invention, the converting layer on the side wall substantially has an uniform thickness.

According to an embodiment of the invention, the vertical ion implantation process includes an n-type ion implantation process.

According to one embodiment of the present invention, the converting process includes an oxidation process.

Based on the above, in the semiconductor process of the invention, the mask layer used to form the opening covers the side wall of the formed opening. Thus, the mask layer is also used as a mask in the vertical ion implantation process, so as to implant the bottom portion of the opening rather than the side wall of the opening. As such, the thickness of the converting layer subsequently formed on the side wall of the opening is larger than the thickness of the converting layer subsequently formed on the bottom portion of the opening. Therefore, the converting layer on the side wall of the opening provides a superior insulation effect.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
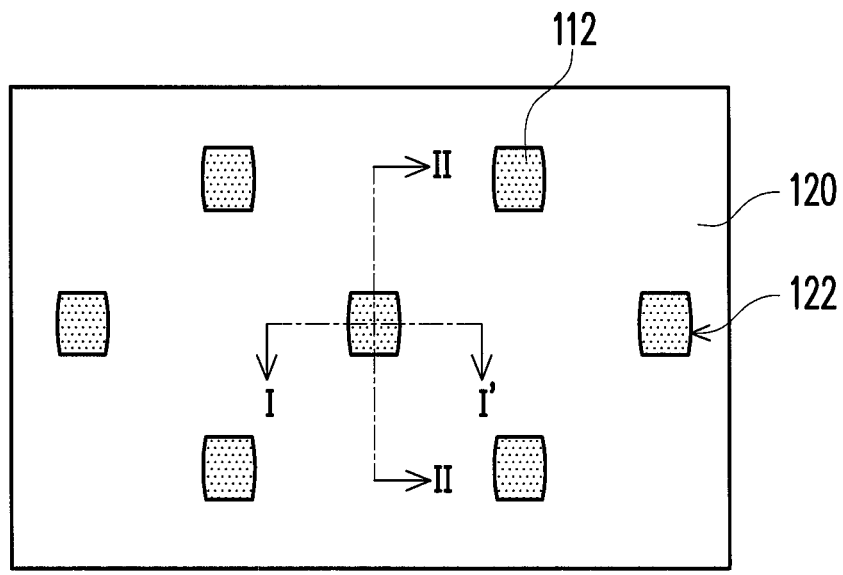
FIG. 1A to FIG. 1E are schematic top views illustrating a semiconductor process according to an embodiment of the invention.

FIG. 1A to FIG. 1E are schematic top views illustrating a semiconductor process according to an embodiment of the invention. FIG. 2A to FIG. 2E are schematic cross-sectional views taken along a line I-I' depicted in FIG. 1A to FIG. 1E. FIG. 3A to FIG. 3E are schematic cross-sectional views taken along a line II-II' depicted in FIG. 1A to FIG. 1E. With reference to FIG. 1A, FIG. 2A, and FIG. 3A, a mask layer 120 is formed on the substrate 100, wherein the mask layer 120 has a first opening 122 exposing a portion of the substrate 100. In this embodiment, a plurality of conductive patterns 110 is formed in the substrate 100 before forming the mask layer 120, and the first opening 122 of the mask layer 120 exposes the substrate 100 between the conductive patterns 110, for example. The first opening 122 is a slit, for example. A dielectric layer 112 is formed on a surface of the substrate 100 and between a portion of the conductive patterns 110 and the substrate 100, and dielectric patterns 114 are formed between a portion of the conductive patterns 110 and the substrate 100, for example, as shown in FIG. 2A and FIG. 3A. In this embodiment, the substrate 100 is, for example, a silicon substrate. The mask layer 120 can include carbonate. The conductive patterns 110 are capacitor pillars, for example. A material of the conductive patterns 110 is polysilicon, for example. A material of the dielectric layer 112 is silicon oxide, and a material of the dielectric patterns 114 is spin-on dielectric (SOD), for example.

Figure 1B:
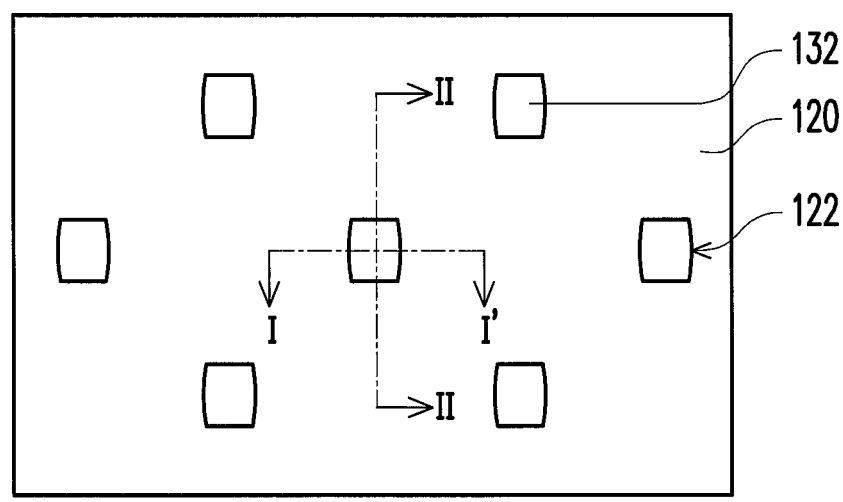
Figure 2A:
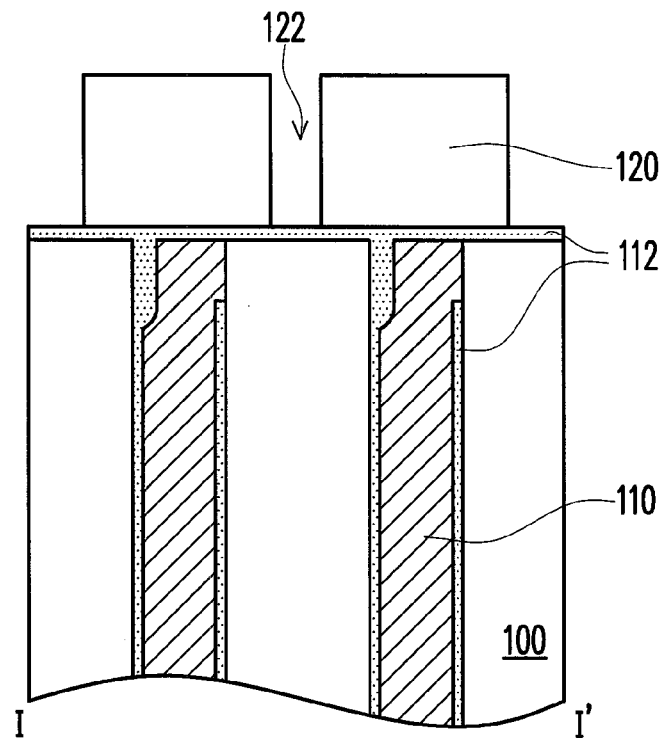
FIG. 2A to FIG. 2E are schematic cross-sectional views taken along a line I-I' depicted in FIG. 1A to FIG. 1E.
Figure 2B:
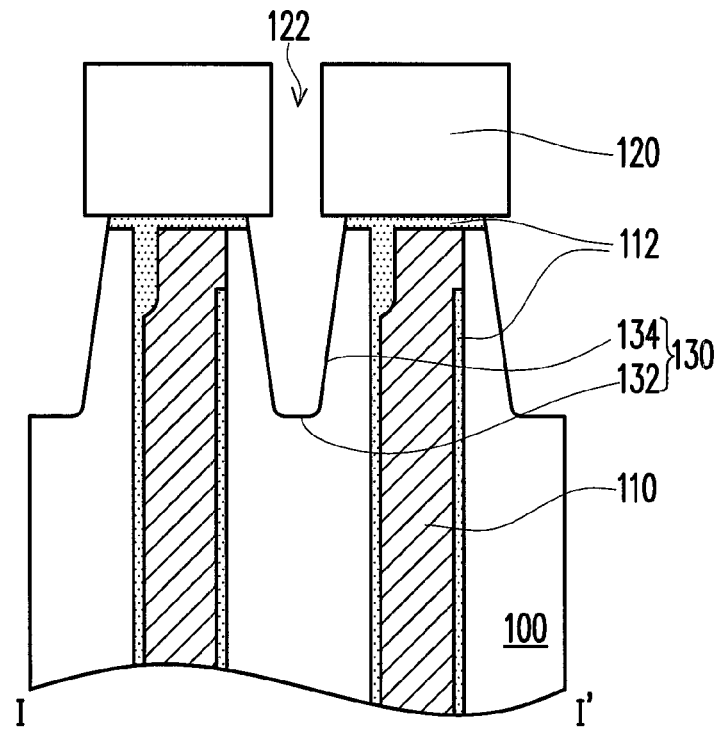
Figure 3A:
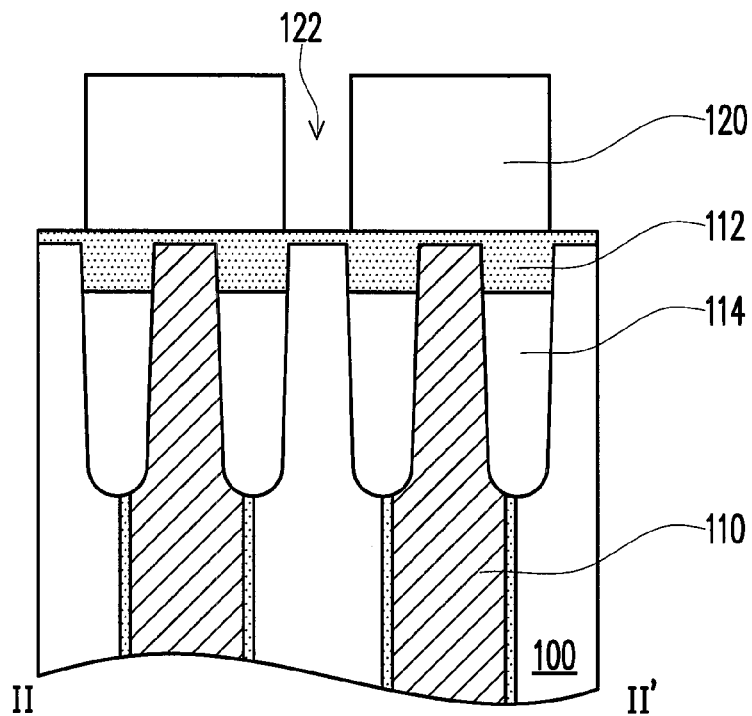
FIG. 3A to FIG. 3E are schematic cross-sectional views taken along a line II-II' depicted in FIG. 1A to FIG. 1E.
Figure 3B:
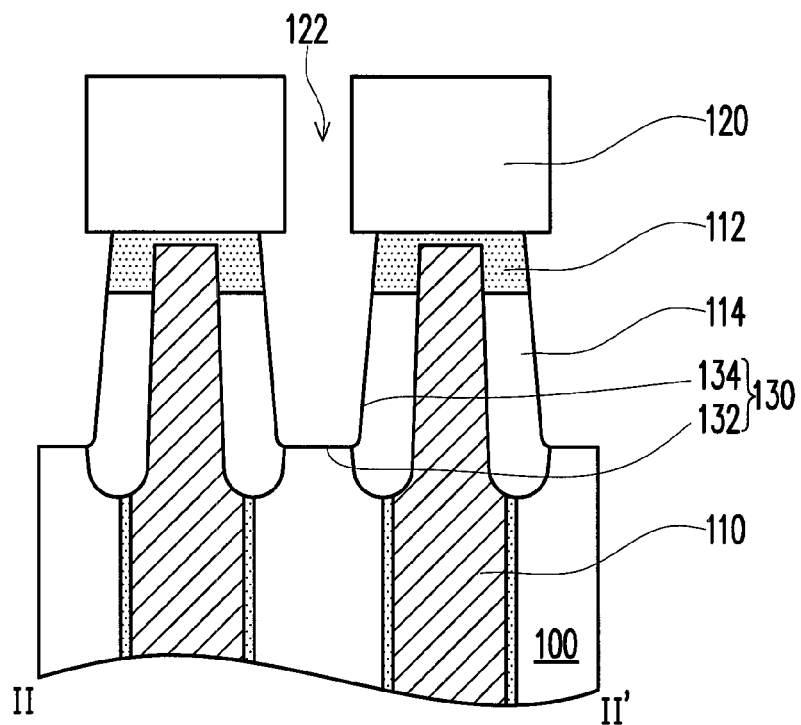

With reference to FIG. 1B, FIG. 2B, and FIG. 3B, then, by using the mask layer 120 as a mask, a dry etching process is performed on the substrate 100 to form a second opening 130 therein. The second opening 130 has a bottom portion 132 and a side wall 134 extending upwards and outwards from the bottom portion 132, wherein the bottom portion 132 is exposed by the first opening 122 of the mask layer 120, and the side wall 134 is covered by the mask layer 120. In this embodiment, the mask layer 120 includes a main body and the first openings disposed in the main body, the side wall 134 is covered by the main body of the mask layer 120, and the bottom portion 132 is exposed by the first opening 122. Here, the dry etching process is, for example, an in-situ widening etching process or others. In other words, the substrate 100 is etched vertically and horizontally by the dry etching process through the first opening 122 of the mask layer 120, so as to form a second opening 130 having a width larger than that of the first opening 122. As such, the bottom portion 132 of the second opening 130 is exposed by the first opening 122 of the mask layer 120, while the side wall 134 of the second opening 130 is covered by the main body of the mask layer 120. In detail, the bottom portion 132 of the second opening 130 exposes a portion of the substrate 100, and the side wall 134 of the second opening 130 exposes a portion of the substrate 100 surrounding the upper portions of the conductive patterns 110, a portion of the dielectric layer 112 surrounding the top portions of the conductive patterns 110, and a portion of the dielectric patterns 114 surrounding the upper portions of the conductive patterns 110, for example. In this embodiment, when a material of the substrate 100 includes silicon, the in-situ widening etching process is performed by using the etching gas with an increased ratio of hydrogen bromide (HBr) and a reduced ratio of oxide, such as the etching gas including 100~200 sccm HBr/20~40 sccm $Cl_2$/0~15 sccm $CF_4$/0~15 sccm $NF_3$/0~10 sccm $O_2$.

Figure 1C:
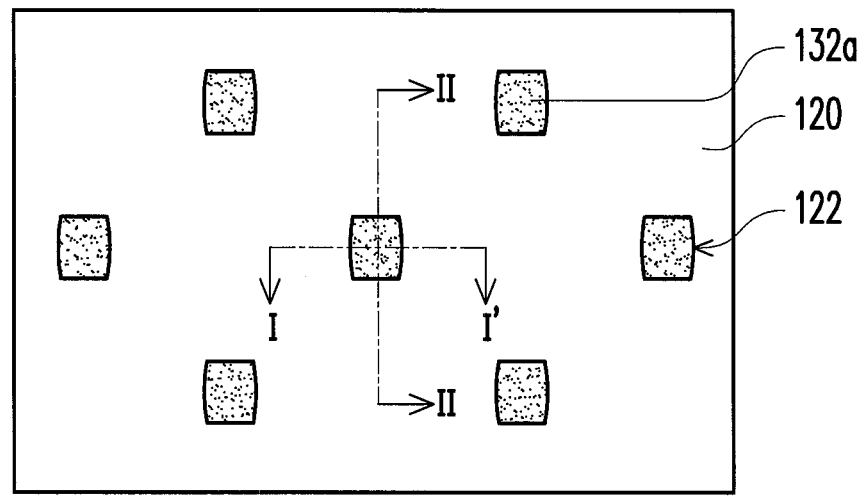
Figure 2C:
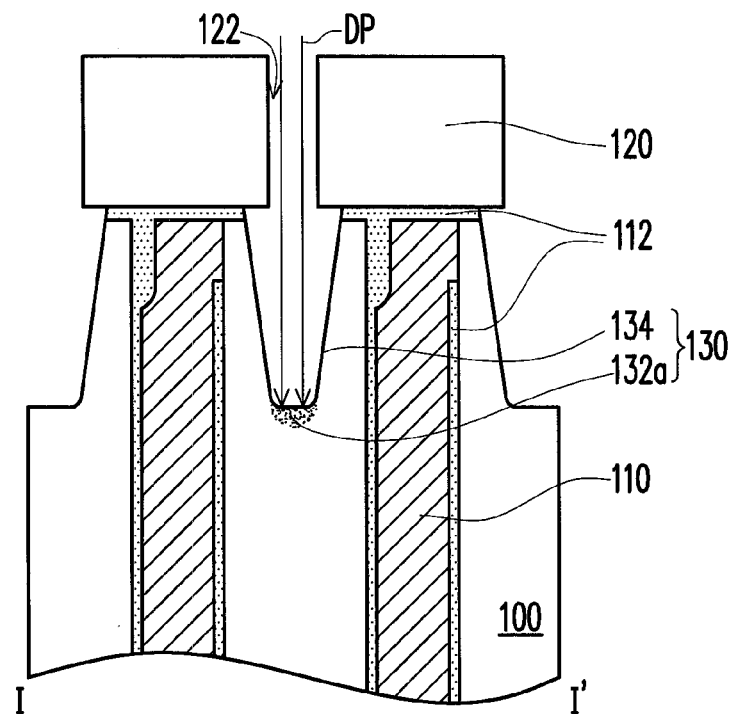
Figure 3C:
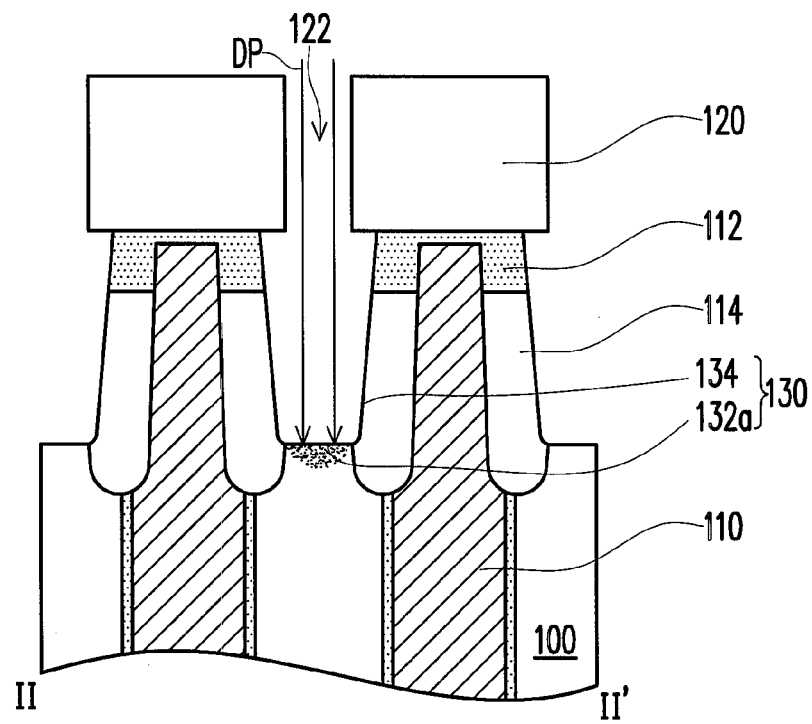

With reference to FIG. 1C, FIG. 2C, and FIG. 3C, after that, by using the mask layer 120 as a mask, a vertical ion implantation process DP is performed on the bottom portion 132 of the second opening 130 through the first opening 122, so as to form a doped bottom portion 132a and keep the side wall 134 undoped. In this embodiment, the vertical ion implantation process DP is an n-type ion implantation process, and the doping ions are nitrogen ions, for example. In detail, the side wall 134 of the second opening 130 is covered by the main body of the mask layer 120, and thus only the substrate 100 at the bottom portion 132, exposed by the first opening 122 of the mask layer 120, is doped by the vertical ion implantation process DP. Contrarily, the material layers including the substrate 100, the dielectric layer 112, and the dielectric patterns 114 at the side wall 134, covered by the main body of the mask layer 120, are not doped. In other words, by utilizing the mask layer 120 and the vertical ion implantation process DP cooperatively, a desired doping profile is easily obtained, and not affected by the scattering effect. Besides, the non-uniformity of implantation on the side wall of the opening is improved.

Figure 1D:
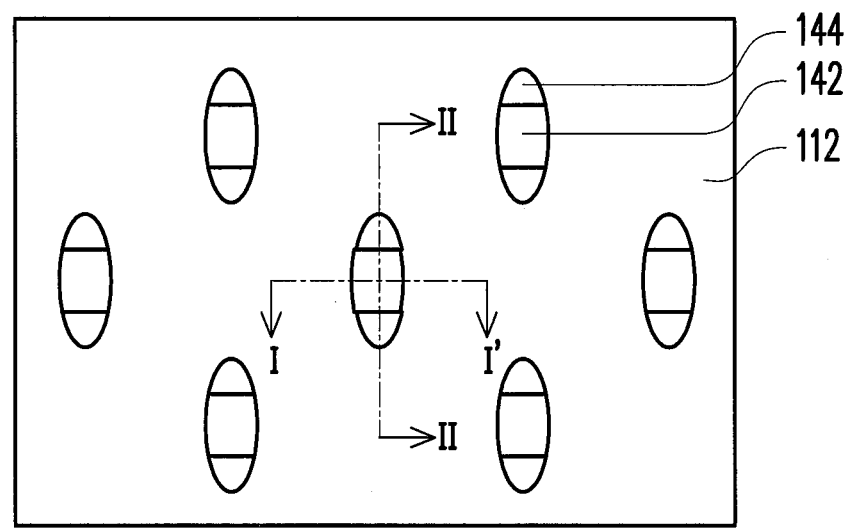
Figure 2D:
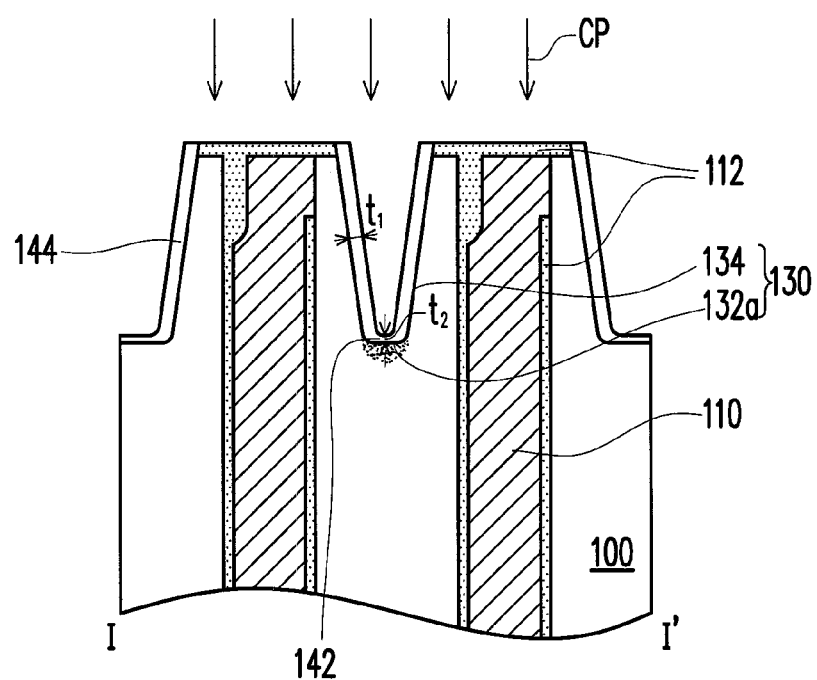
Figure 3D:
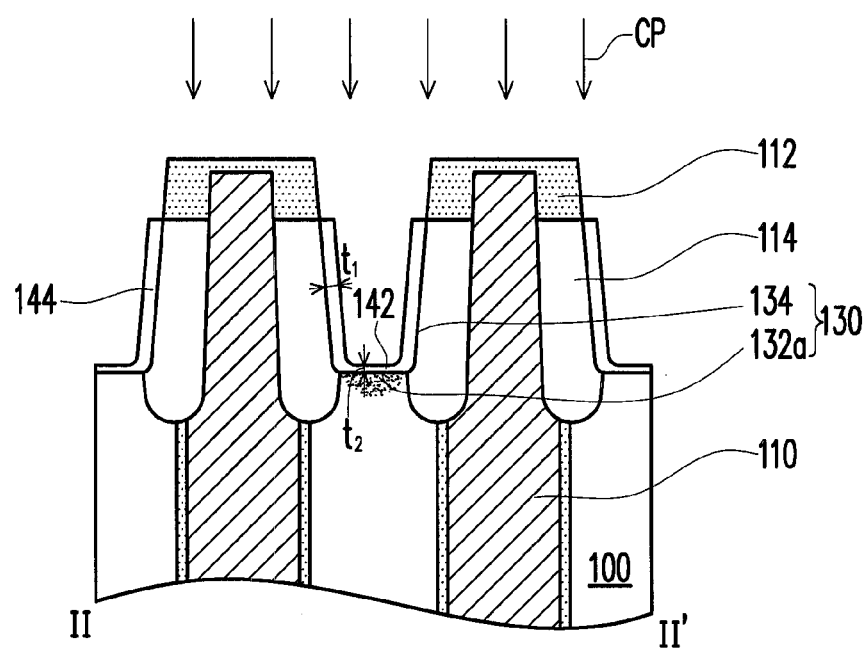

With reference to FIG. 1D, FIG. 2D, and FIG. 3D, the mask layer 120 is removed after the vertical ion implantation process DP. After that, a conversion process CP is performed on the substrate 100, so as to form converting layers 142, 144 on the side wall 134 and the bottom portion 132a of the second opening 130, wherein a thickness t1 of the converting layer 144 on the side wall 134 is larger than a thickness t2 of the converting layer 142 on the bottom portion 132a. In this embodiment, the conversion process CP is an oxidation process, and a material of the converting layers 142, 144 is oxide, for example. Notes that the substrate 100 at the bottom portion 132 of the second opening 130 is doped to form a doped bottom portion 132a and the material layers at the side wall 134 of the second opening 130 is undoped in the preceding step, and thus the thickness t1 of the converting layer 144 formed on the side wall 134 is consequentially larger than a thickness t2 of the converting layer 142 formed on the bottom portion 132a in the conversion process CP. Besides, since the material layers at the side wall 134 of the second opening 130 is substantially undoped, the thickness t1 of the converting layer 144 formed on the side wall 134 of the second opening 130 is substantially uniform.

Figure 1E:
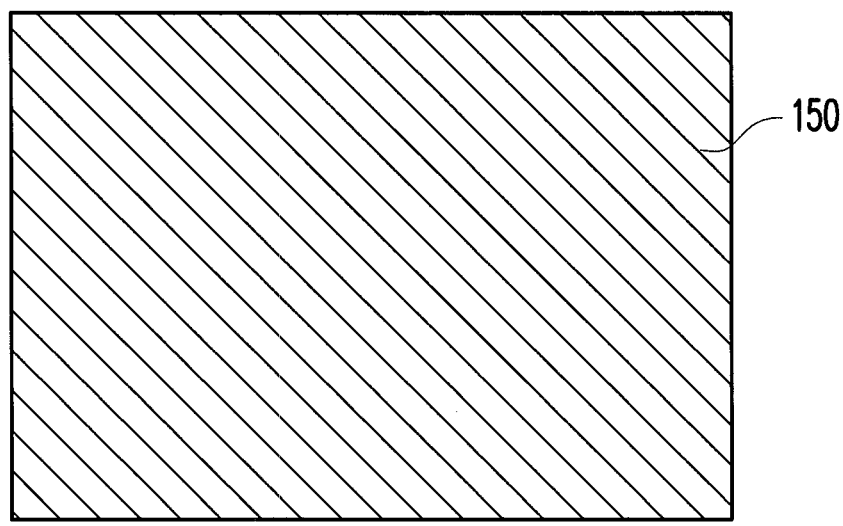
Figure 2E:
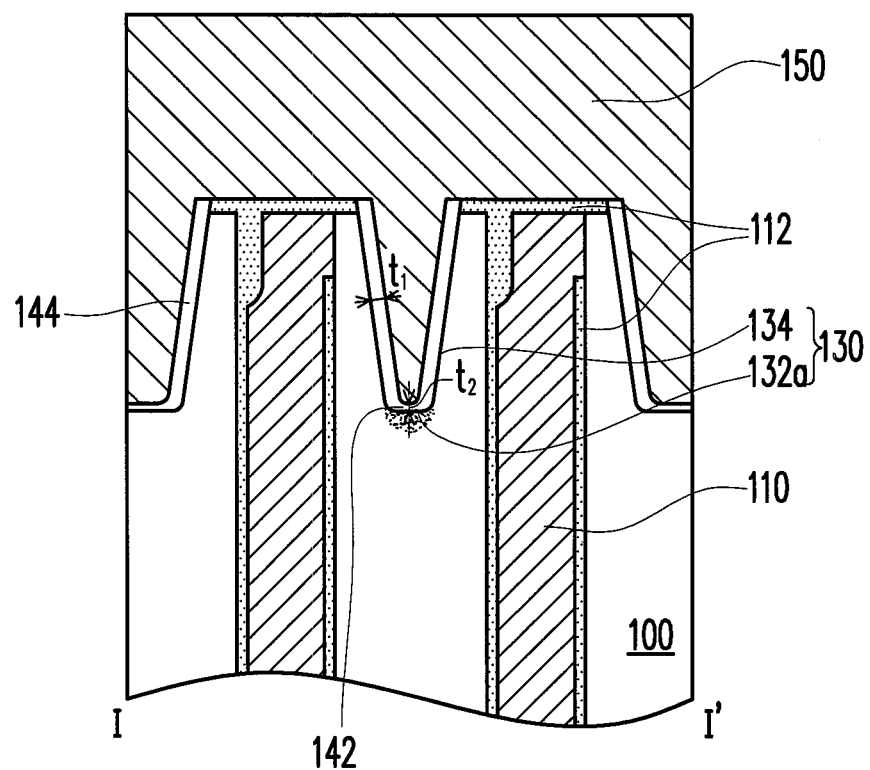
Figure 3E:
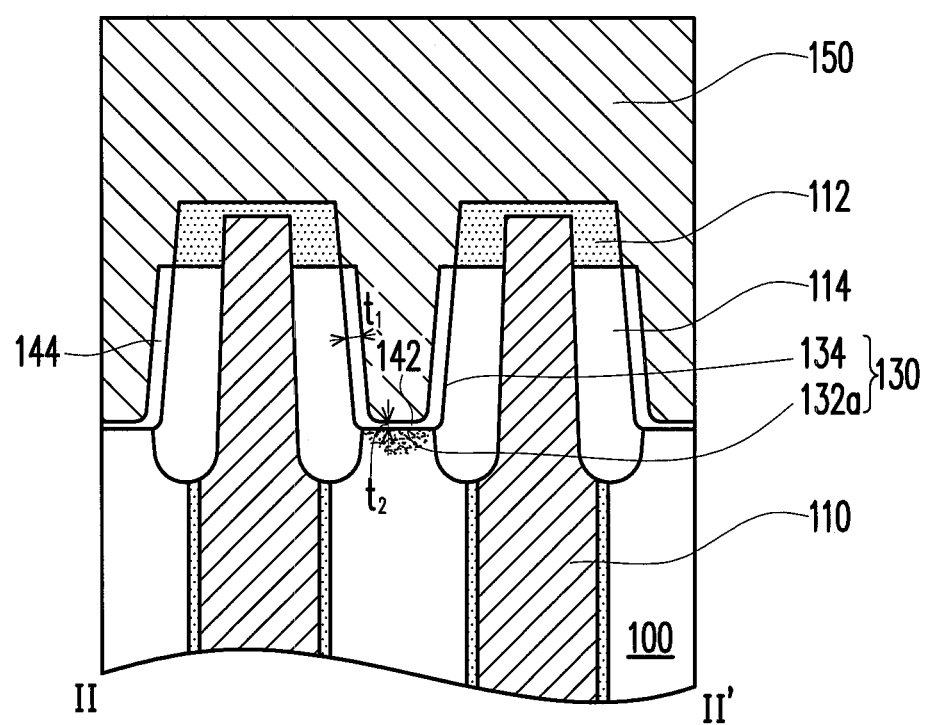

With reference to FIG. 1E, FIG. 2E, and FIG. 3E, afterwards, a conductive layer 150 is formed on the substrate 100, wherein the conductive layer 150 is filled in the second opening 130. In this embodiment, the conductive layer 150 is a gate layer, and a material of the conductive layer 150 is polysilicon, for example. Particularly, in this embodiment, the conductive layer 150 and the conductive patterns 110 are electrically insulated from each other by the converting layer 142 and the converting layer 144 which has a substantially uniform thickness.

In the semiconductor process of the present embodiment, by utilizing the in-situ widening etching process, the side wall 134 of the formed opening 130 is covered by the mask layer 120 which is used to form the opening 130. Then, the vertical ion implantation process DP is performed on the bottom portion 132 of the opening 130 by using the same mask layer 120 as a mask. Since the side wall 134 of the opening 130 is covered by the mask layer 120, the side wall 134 of the opening 130 is substantially kept undoped. As such, the thickness t1 of the converting layer 144 subsequently formed on the side wall 134 of the opening 130 is consequentially larger than the thickness t2 of the converting layer 142 subsequently formed on the bottom portion 132 of the opening 130, and the thickness t1 of the converting layer 144 formed on the side wall 134 of the opening 130 which is undoped is substantially uniform. Therefore, the converting layer 144 disposed on the side wall 134 of the opening 130 provides a superior insulation effect.

In this embodiment, by using the mask layer as a mask to form the opening and perform the implantation process to cover the side wall of the opening, the bottom portion of the opening is doped while the side wall of the opening is undoped. Namely, in the semiconductor process of the embodiment, it is not required to prepare another mask layer or other additional tools to cover the side wall of the opening in the implantation process, and thus the overall process is simplified and the cost of the semiconductor process is reduced. Moreover, the converting layer with an increased thickness is uniformly formed on the side wall of the opening, and therefore the converting layer provides a superior insulation effect between the conductive layer subsequently formed in the opening and the conductive patterns disposed between the openings. Accordingly, the characteristics of the semiconductor device are improved.

It should be noted that in the embodiment, the opening is formed in the substrate having complex structure (i.e. conductive patterns 110, dielectric layer 112, and dielectric patterns 114) as shown in FIG. 2A and FIG. 3A, but the invention is not limited thereto. In other words, the invention can be applied to other semiconductor processes to form an opening having a bottom portion and a side wall which have different doping properties.

In light of the foregoing, in the semiconductor process of the invention, the mask layer used to form the opening covers the side wall of the formed opening. Thus, the mask layer is also used as a mask in the vertical ion implantation process, so as to implant the bottom portion of the opening rather than the side wall of the opening. As such, the thickness of the converting layer subsequently formed on the side wall of the opening is larger than the thickness of the converting layer subsequently formed on the bottom portion of the opening, and thus the converting layer on the side wall of the opening provides a superior insulation effect. Accordingly, the overall process to fabricate the semiconductor device is simplified and the cost of the semiconductor process is greatly reduced. Moreover, the insulation effect and the characteristics of the semiconductor devices are improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor process, comprising:
    forming a plurality of conductive patterns in a substrate;
    after forming the conductive patterns, forming a mask layer on the substrate, wherein the mask layer has a first opening exposing a portion of the substrate;
    by using the mask layer as a mask, performing a dry etching process on the substrate to form a second opening between the conductive patterns in the substrate, wherein the second opening has a bottom portion and a side wall extending upwards and outwards from the bottom portion, the bottom portion is exposed by the first opening of the mask layer, and the side wall is-covered by the mask layer;
    by using the mask layer as a mask, performing a vertical ion implantation process on the bottom portion of the second opening through the first opening; and
    performing a conversion process on the substrate, so as to form converting layers on the side wall and the bottom portion of the second opening, wherein a thickness of the converting layer on the side wall is larger than a thickness of the converting layer on the bottom portion.

2. The semiconductor process as claimed in claim 1, wherein the dry etching process comprises an in-situ widening etching process.

3. The semiconductor process as claimed in claim 1, wherein the side wall of the second opening is covered by the mask layer during the vertical ion implantation process.

4. The semiconductor process as claimed in claim 1, before performing the converting process, further comprising removing the mask layer.

5. The semiconductor process as claimed in claim 1, after performing the converting process, further comprising forming a conductive layer in the second opening.

6. The semiconductor process as claimed in claim 1, wherein the first opening comprises a slit.

7. The semiconductor process as claimed in claim 1, wherein the converting layer on the side wall substantially has an uniform thickness.

8. The semiconductor process as claimed in claim 1, wherein the vertical ion implantation process comprises an n-type ion implantation process.

9. The semiconductor process as claimed in claim 1, wherein the converting process comprises an oxidation process.

\* \* \* \* \*